(12) United States Patent
Drimer

(10) Patent No.: US 7,550,858 B1
(45) Date of Patent: Jun. 23, 2009

(54) RANDOM SEQUENCE GENERATION USING ALPHA PARTICLE EMISSION

(75) Inventor: Saar Drimer, Santa Cruz, CA (US)

(73) Assignee: Xilinx, Inc., San Jose, CA (US)

( * ) Notice: Subject to any disclaimer, the term of this patent is extended or adjusted under 35 U.S.C. 154(b) by 430 days.

(21) Appl. No.: 11/184,311

(22) Filed: Jul. 19, 2005

(51) Int. Cl.
    H01L 23/48 (2006.01)
(52) U.S. Cl. ................................................ 257/781
(58) Field of Classification Search ......... 438/199, 438/260, 264; 257/208–211, 295, 311; 326/9, 326/14, 38–41, 44; 365/149, 154, 158, 171, 365/174; 714/8, 30, 48, 718, 732, 804
See application file for complete search history.

(56) References Cited

U.S. PATENT DOCUMENTS

| | | | |
|---|---|---|---|
| 6,144,103 A * | 11/2000 | Miller et al. | 257/781 |
| 6,548,392 B2 * | 4/2003 | Akram et al. | 438/612 |
| 7,328,377 B1 * | 2/2008 | Lewis et al. | 714/48 |
| 7,334,159 B1 * | 2/2008 | Callaghan | 714/30 |
| 2006/0150062 A1 * | 7/2006 | Huang | 714/763 |
| 2007/0016843 A1 * | 1/2007 | Griseta et al. | 714/805 |
| 2007/0032065 A1 * | 2/2007 | Porter et al. | 438/613 |
| 2007/0050599 A1 * | 3/2007 | Porter et al. | 712/24 |
| 2007/0300100 A1 * | 12/2007 | Foss | 714/5 |

* cited by examiner

*Primary Examiner*—Charles D Garber
*Assistant Examiner*—Andre' C Stevenson
(74) *Attorney, Agent, or Firm*—W. Eric Webostad

(57) ABSTRACT

Generation of a random sequence using alpha particle emissions is described. A device includes memory cells, an alpha particle emitter, and read circuitry. The memory cells are sensitive to alpha particle emissions. The alpha particle emitter is proximate to the memory cells for changing state of one or more bits of the memory cells within a period of time. The read circuitry is coupled to the memory cells and configured to periodically issue a read command to periodically read the memory cells.

17 Claims, 4 Drawing Sheets

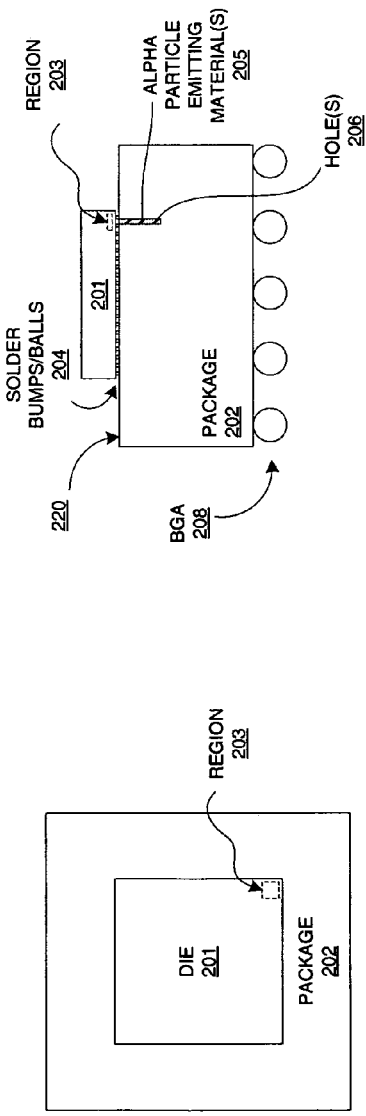
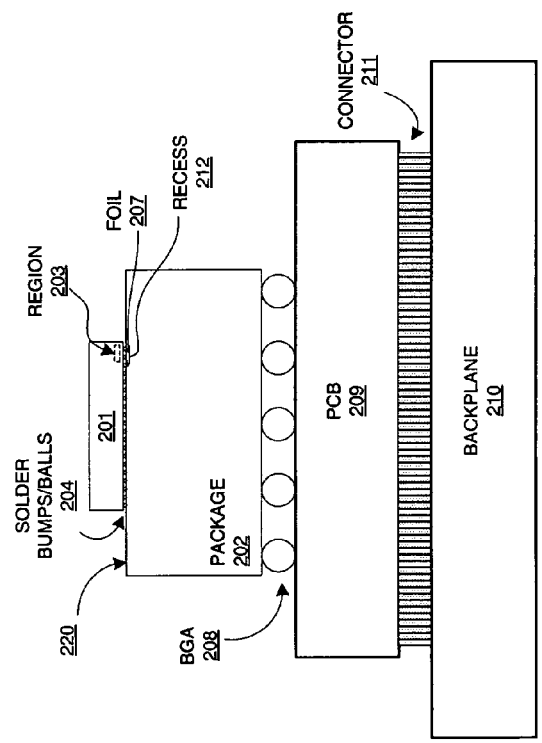

RANDOM SEQUENCE GENERATION USING ALPHA PARTICLE EMISSION

FIELD OF THE INVENTION

One or more aspects of the invention relate generally to integrated circuits and, more particularly, to generation of a random sequence using alpha particle emissions.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA, the Xilinx Virtex® FPGA, is available from. Xilinx Inc., 2100 Logic. Drive San. Jose Calif. 95124. Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in. Programmable. Logic. Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

Random numbers, or more generally a random sequence, may be used in a variety of applications in engineering and computing fields. Although random events occur in nature, such as thermal noise and radioactive decay, true random number generation by definition would be unpredictable, irreproducible, and non-repeating. Therefore, it is difficult to provide true random number generation in an integrated circuit. Heretofore, hardware and software random number generators used pseudo-random sequences that are not true random number sequences. For example, conventional pseudo-random sequence generators use seed information (a "seed"), and any information regarding the seed may lead to complete knowledge of the generated sequence. Accordingly, security and other cryptographic applications may be enhanced by providing true random number generation.

Thus, it would be desirable and useful to provide means for true random number generation for an integrated circuit.

SUMMARY OF THE INVENTION

One or more aspects of the invention generally relate to integrated circuits and, more particularly, to generation of a random sequence using alpha particle emissions.

An aspect of the invention is a device for random data generation. The device includes memory cells, an alpha particle emitter, and read circuitry. The memory cells are sensitive to alpha particle emissions. The alpha particle emitter is proximate to the memory cells for changing state of one or more bits of the memory cells within a period of time. The read circuitry is coupled to the memory cells and configured to periodically issue a read command to periodically read the memory cells.

Another aspect of the invention is a device for random number generation, including an integrated circuit die, an integrated circuit package, an alpha particle emitter, and read circuitry. The integrated circuit die includes memory cells sensitive to alpha particle emissions. The integrated circuit package is coupled to the integrated circuit die. The alpha particle emitter is proximate to the memory cells for changing state of one or more bits of the memory cells within a period of time. The read circuitry is coupled to read the memory cells to provide a random sequence of numbers responsive to the alpha particle emissions changing the state of the one or more bits of the memory cells.

Yet another aspect of the invention is a method of manufacturing devices for random data generation. An integrated circuit die is formed. An integrated circuit package is coupled to the integrated circuit die. The integrated circuit package is selected from integrated circuit packages including at least one type of alpha particle emitter-configured integrated circuit package.

BRIEF DESCRIPTION OF THE DRAWINGS

Accompanying drawing(s) show exemplary embodiment (s) in accordance with one or more aspects of the invention; however, the accompanying drawing(s) should not be taken to limit the invention to the embodiment(s) shown, but are for explanation and understanding only.

FIG. 2A is a high-level top view depicting an exemplary embodiment of an integrated circuit die coupled to an integrated circuit package.

FIG. 2B is a high-level side view depicting an exemplary embodiment of the integrated circuit die and integrated circuit package of FIG. 2A.

FIG. 2C is a high-level side view depicting an alternative exemplary embodiment of the integrated circuit die and integrated circuit package of FIG. 2A.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
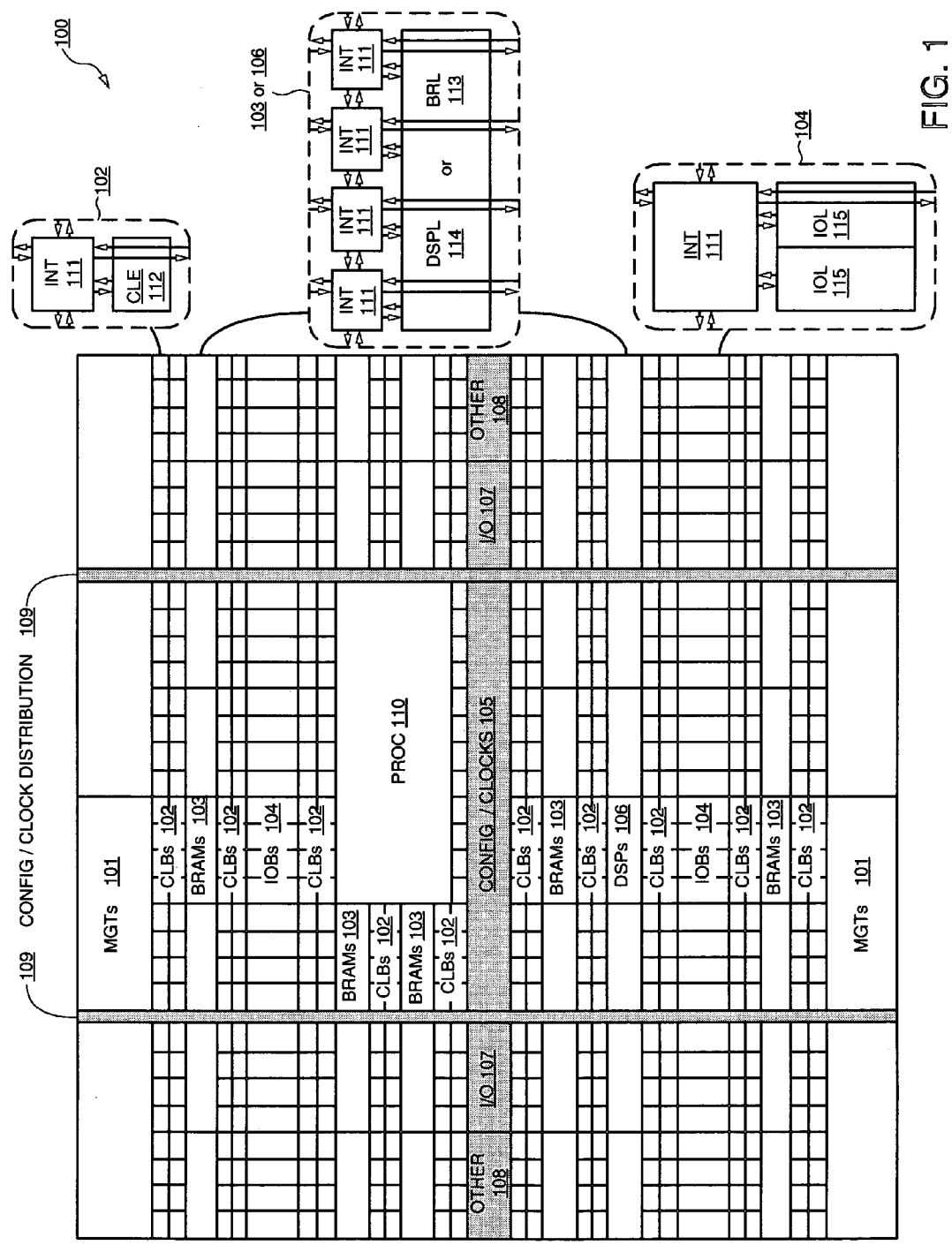
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110. FPGA 100 may be used to implement system 100 of FIG. 1. In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a. Virtex-4™ FPGA from. Xilinx of. San Jose Calif.

FIG. 2A is a high-level top view depicting an exemplary embodiment of an integrated circuit die ("die") 201 coupled to an integrated circuit package ("package") 202. There are many known ways of making memory cells more sensitive to alpha particle emissions. At least a portion of the memory cells formed in die 201 may be configured to be sensitive to alpha particle emissions. Die 201 includes a region 203. Region 203 is for the formation of one or more memory cells configured to be sensitive to alpha particle emissions. This sensitivity may be facilitated by sizing transistors to be more sensitive to alpha particle emissions, conventionally making such transistors smaller. Alternatively, with respect to a one transistor-one capacitor random access memory ("RAM") cell, a capacitor may be sized smaller such that it is more susceptible to charge leakage induced by alpha particle emissions.

FIG. 2B is a high-level side view depicting an exemplary embodiment of die 201 coupled to package 202 of FIG. 2A. Die 201 is coupled to package via solder bumps or balls 204. Additionally, package 202 may be associated with a ball grid array ("BGA") 208. Notably, though a flip-chip fine-pitch BGA package is described, other known types of packaging may be used.

One or more holes or cavities 206 may be formed in package 202. Holes 206 may have respective openings generally along a top surface 220 of package 202. Each such opening may be proximate to region 203 responsive to coupling of die 201 to package 202. One or more holes 206 may be filled with an alpha particle emitting material or materials 205. An example of such an alpha particle-emitting material is lead.

As is known, radioactive decay produces random events. However, most radioactive materials are bulky and impractical for use with a die 201 coupled to a printed circuit board ("PCB") or other commercial product. However, a low energy radioactive material that emits alpha particles, such as lead or thorium, may be used. As is known, alpha particles are low energy and effect change in close proximity to an object, which in this example embodiment is an array of memory cells, which may be configured to be sensitive to alpha particle emissions. As is known, a single event upset ("SEU") in an array of memory cells may occur due to alpha particle emissions. Such an SEU may cause a memory cell to change state, either from a stored logic 0 to a stored logic 1 or from a stored logic 1 to a stored logic 0. As alpha particles are low energy, alpha particle-emitting material is located in or nearly in contact with die 201 to cause memory cells to change state.

Notably, the degree of sensitivity of memory cells or the amount of exposure to alpha particles, or a combination thereof, may depend on the application, namely how often one or more memory cells are to have their state changed within a period of time in order to produce a random event within such period of time. In other words, generation of a random sequence, namely the number of random bits per some unit of time, is application-dependent. Furthermore, the size of the pool of available random numbers may be dependent upon the size, or more particularly the number of bits, in an array of memory cells. Examples of sizes of memory cell arrays that may be used are 1K, 2K, 4K, etc. bits. In other words, it should be appreciated that a random sequence may be generated with a relatively small number of bits. The number of possible random numbers may depend upon the size of the array of memory cells, and accordingly the size of the array of memory cells may vary from application to application. Notably, the rate of change of the state of bits responsive to alpha particle emissions may depend upon the amount of material used for such alpha particle emitter and may further depend on the amount of surface area emitting alpha particles therefrom. Accordingly, the rate at which bits of an array of memory cells change state may be varied according to formation of an alpha particle emitter and thus tailored to a particular application. Notably, though random numbers are described, other types of random data may be generated. Though, it should be appreciated that output random data is represented as a binary number when output from a memory array.

FIG. 2C is a high-level side view depicting an alternative exemplary embodiment of die 201 coupled to package 202 of FIG. 2A. In FIG. 2C, an alpha particle-emitting foil 207 is coupled to a top surface 220 of package 202. Alpha particle-emitting foil 207 may be a foil that includes thorium. The size and shape of foil 207 may generally approximate the area of region 203 with reference to a bottom planar area of such region. In this particular embodiment, foil 207 is coupled to package 202 to be proximate to region 203 responsive to coupling die 201 to package 202 via solder bumps or balls 204. Notably, package 202 of FIG. 2C may have a recess 212 for receiving foil 207. However, foil 207 may be directly coupled to die 201 proximate to region 203. Alternatively, foil 207 may be coupled to both die 201 and package 202 to be proximate to region 203. Furthermore, alternatively, foil 207 may be held in place by coupling die 201 to package 202, such as a friction fit or being held in place by solder bumps 204. Additionally, in FIG. 2C, it is shown that package 202 may be coupled to a PCB 209 via BGA 208. PCB 209 may be coupled to a back plane 210 via connector 211. Although the particular types of coupling of die 201 to package 202 and package 202 to PCB 209 are illustratively shown, it should be understood that other types of wire bonding or other known interconnect technology may be used. For example, other types of interconnect technology that might replace BGA 208 include land grid array ("LGA") and column grid array ("CGA"), among other known interconnect technologies for coupling a package to a PCB.

Thus, an alpha particle emitter is located between die 201 and top surface 220 of package 202 for the embodiment illustratively shown in FIG. 2C. However, in both the embodiments of FIGS. 2B and 2C, an alpha particle emitter is located between at least a portion of package 202 and die 201.

Figure 3A:
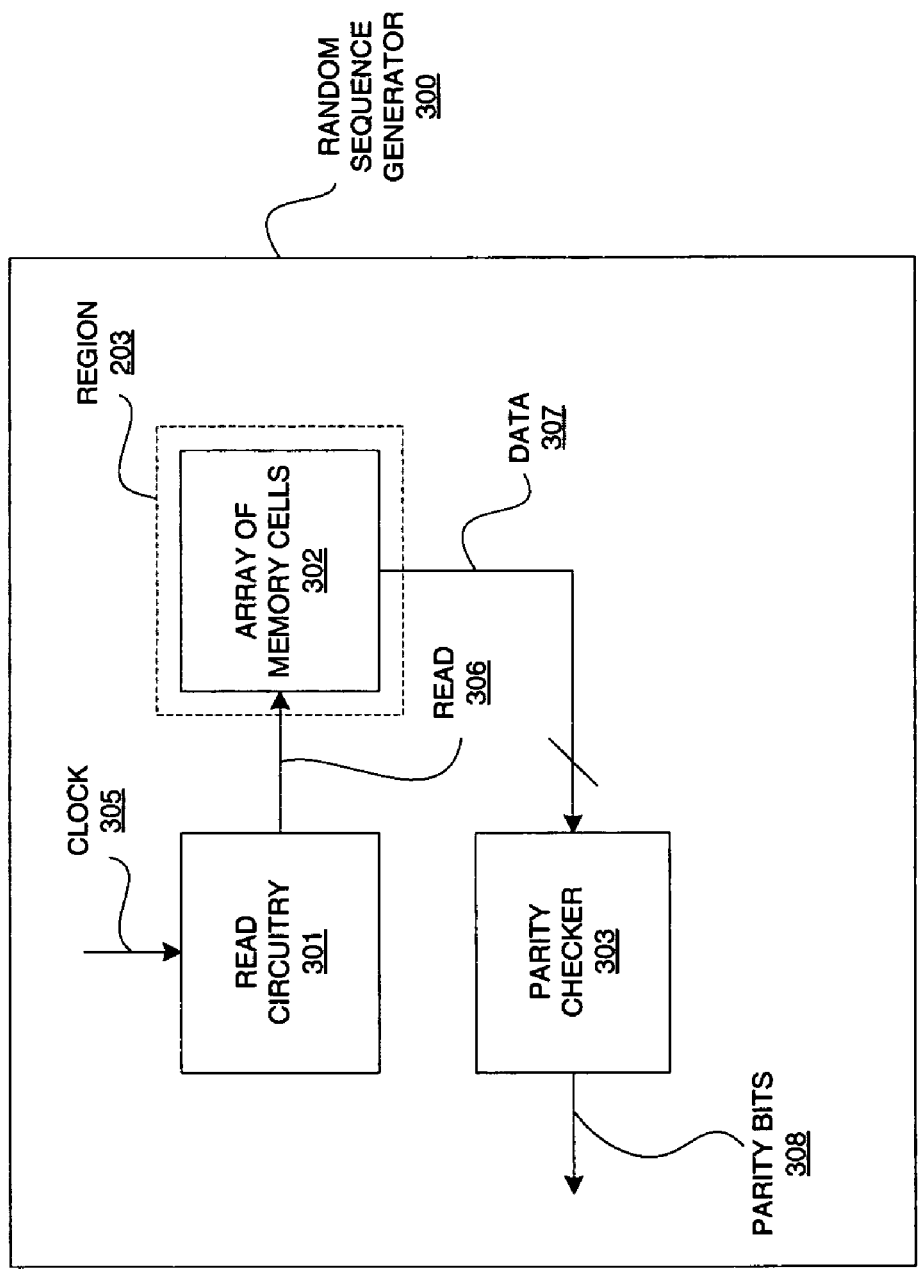
FIG. 3A is a high-level block diagram depicting an exemplary embodiment of a random sequence generator.

FIG. 3A is a high-level block diagram depicting an exemplary embodiment of a random sequence generator 300. Random sequence generator 300 includes read circuitry 301, array of memory cells 302, and parity checker 303. Responsive to frequency of clock signal 305 input to read circuitry 301, read circuitry 301 periodically issues a read command 306 to array of memory cells 302. Array of memory cells 302 may include one or more memory cells configured to be sensitive to alpha particle emissions. Alternatively, conventional memory cells, known to have some degree of susceptibility to alpha particle emissions, may be used. Array of memory cells 302 is formed in region 203 as illustratively shown by a dashed box in FIG. 3A.

Responsive to read command 306, array of memory cells 302 is read to provide a random sequence of data 307. Array of memory cells 302 may be written with logic 1s and logic 0s, all logic 1s, or all logic 0s. Notably, regardless of the initial logic 1s and 0s written to array of memory cells 302, proximity to an alpha particle emitter, such as was described with reference to FIGS. 2B and 2C, will cause one or more of such memory cells to randomly change state owing to collisions between alpha particles and die 201 of FIGS. 2B and 2C, for example. More particularly, while not wishing to be bound by theory, it is believed that the alpha particles colliding with the silicon of a semiconductor die 201 can cause one or more memory cells 302 to change state randomly. Notably, array of memory cells 302 may be read all at once, or some portion thereof may be read at a time. For example, one word of data may be read out at a time to provide data 307. This word of data may be checked by parity checker 303 for either odd or even parity. Output of a result of such a parity check may be provided as a stream of parity bits 308. It should be appreciated that for a sufficient interval of time between reads of array of memory cells 302, namely a sufficient amount of exposure time to alpha particle emission that at least one bit is likely to change state, random events will cause one or more of the words stored in array of memory cells 302 to go from either odd to even parity, or even to odd parity. Accordingly, parity bitstream 308 will be a random sequence of bits. Notably, because alpha particles are such low energy, use of a localized alpha particle emitter may be positioned such that alpha particle emissions do not have effect on other memory cells, namely, memory cells other than those in array of memory cells 302 in region 203 of die 201 of FIGS. 2B and 2C, for example. Thus, it should be appreciated that locating region 203 in a remote site of die 201, such as a corner as illustratively shown in FIG. 2A, facilitates reducing the possibility of exposure of other circuitry, such as other memory cells, of die 201 to alpha particle radiation.

Notably, read circuitry 301 may be configured to continuously read data from array of memory cells 302 responsive to frequency of clock signal 305. Thus, one or more memory cells of array 302 need not be reset or otherwise managed, as such memory cells may be changed in state either from a logic 1 to a logic 0 or a logic 0 to a logic 1 due to exposure to alpha particle emission, which reduces the complexity of read circuitry 301.

Figure 3B:
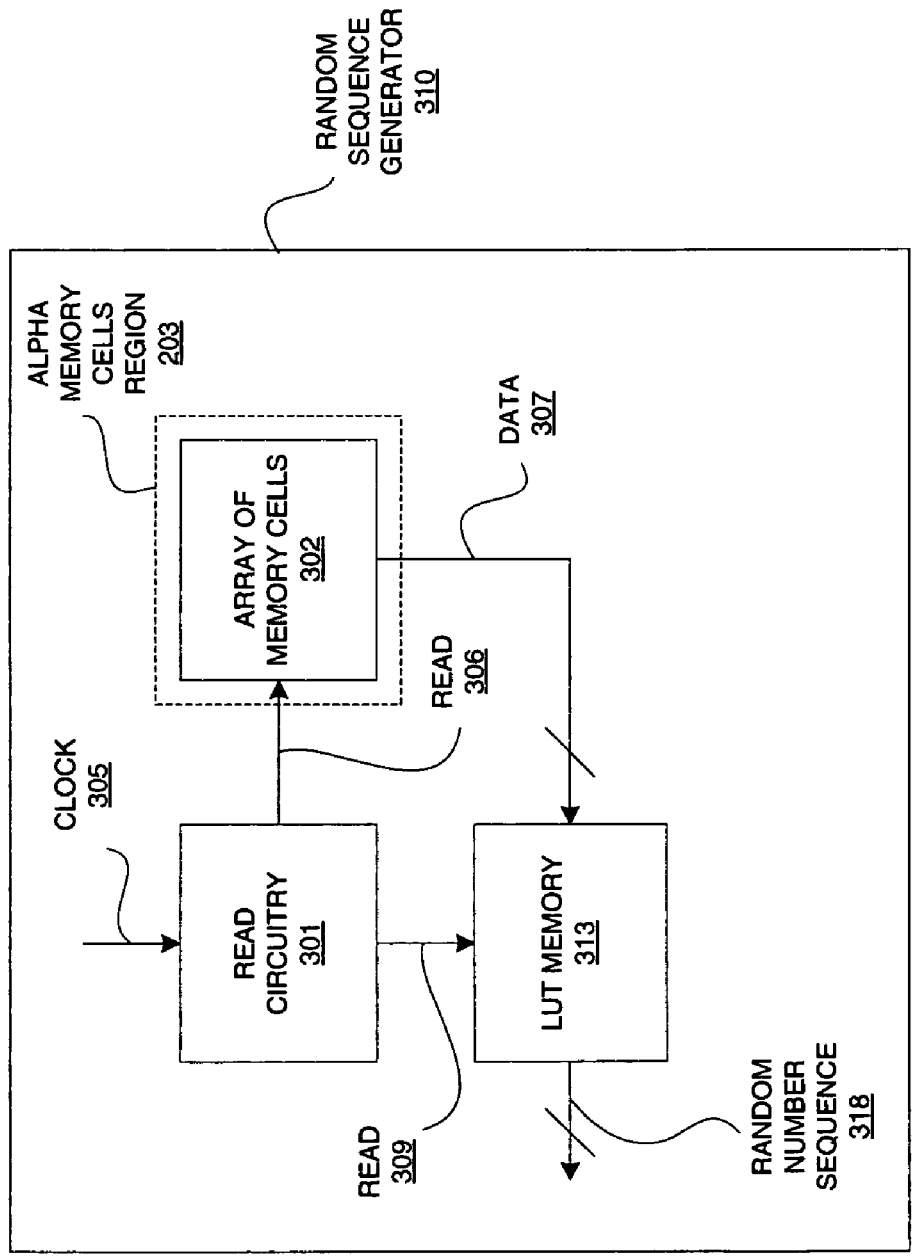
FIG. 3B is a high-level block diagram depicting an exemplary alternative embodiment of a random sequence generator.

FIG. 3B is a high-level block diagram depicting an exemplary alternative embodiment of a random sequence generator 310. Random sequence generator 310 is substantially similar to random sequence generator 300 of FIG. 3A, except that parity checker 303 is replaced with lookup table ("LUT") memory 313. Accordingly, as the description would be repetitive between FIGS. 3A and 3B, the description of FIG. 3B is directed to only the differences.

Read circuitry 301 may periodically issue a read command 309 to LUT memory 313 responsive to frequency of clock signal 305. LUT memory 313 may be lookup table random access memory ("LUTRAM"). As is known, LUTRAM may be configured using a CLB of an FPGA. LUT memory 313 may be a table of numbers which are indexed according to data words. Thus, each time a data word is read from array of memory cells 302 and provided to LUT memory 313 via data signal 307, LUT memory 313 responsive to read command 309 may read a number associated with the data word read. LUT memory 313 may output the number as indexed to the received data word. Accordingly, LUT memory 313 may output a random number sequence responsive to the reading of numbers from LUT memory 313 in response to data words read from array of memory cells 302.

Notably, not all applications of every integrated circuit die need to have random number generation capability. Accordingly, die 201 may be coupled to a conventional package or a package having an alpha particle emitter, the latter of which may be a configuration provided in responsive to purchaser option. Thus, for purchasers wishing to have a random number generation capability, die 201 would be coupled to a package 202 having an alpha particle emitter coupled or attached thereto. In this manner, circuitry for a random sequence generator, such as random sequence generator 300 of FIG. 3A or random sequence generator 310 of FIG. 3B, may be included in each die 201. However, such random sequence generation would not be activated unless a user opted to have a package, such as package 202 of FIG. 2B or 2C, coupled to die 201.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A device for random data generation, comprising:
   memory cells, the memory cells being sensitive to alpha particle emissions;
   an alpha particle emitter proximate to the memory cells to cause changing of state of one or more bits of the memory cells within a period of time;
   the alpha particle emitter being positioned proximate to the memory cells to cause random events associated with the changing of state for generation of a random sequence; and
   read circuitry coupled to the memory cells and configured to periodically issue a read command to periodically read the memory cells.

2. The device according to claim 1, further comprising a parity checker coupled to receive read data from the memory cells and to provide a parity bit stream responsive thereto.

3. The device according to claim 1, further comprising look-up table memory coupled to receive read data from the memory cells and to provide a number output responsive thereto.

4. The device according to claim 3, wherein the look-up table memory is configured with numbers indexed to possible data words of the read data read from the memory cells, the look-up table memory configured to output a number of the numbers responsive to the read data to provide a random number sequence.

5. The device according to claim 4, wherein the look-up table memory is look-up table random access memory configured from a configurable logic block of a programmable logic device.

6. The device according to claim 5, wherein the programmable logic device is a Field Programmable Gate Array.

7. The device according to claim 1, wherein the alpha particle emitter includes lead.

8. The device according to claim 1, wherein the alpha particle emitter includes thorium.

9. A device for random number generation, comprising:
   an integrated circuit die, the integrated circuit die including memory cells sensitive to alpha particle emissions;
   an integrated circuit package coupled to the integrated circuit die;
   an alpha particle emitter proximate to the memory cells to cause changing of state of one or more bits of the memory cells within a period of time;
   the alpha particle emitter being positioned proximate to the memory cells to cause random events associated with the changing of state for generation of a random sequence of numbers; and
   read circuitry coupled to read the memory cells to provide the random sequence of numbers responsive to the alpha particle emissions changing the state of the one or more bits of the memory cells.

10. The device according to claim 9, wherein the alpha particle emitter is placed into a cavity defined by the integrated circuit package, the cavity defined by the integrated circuit package being located proximate to a region of the integrated circuit die associated with the memory cells responsive to the integrated circuit die and the integrated circuit package being coupled to one another.

11. The device according to claim 9, wherein the integrated circuit package defines a shallow recess along a top surface of the integrated circuit package for placing the alpha particle emitter therein.

12. The device according to claim 10, wherein the cavity defined by the integrated circuit package is located between the integrated circuit die and a portion of the integrated circuit package.

13. The device according to claim 12, wherein the alpha particle emitter is lead.

14. The device according to claim 12, wherein the integrated circuit package is a flip-chip fine-pitch ball grid array package.

15. The device according to claim 11, wherein the alpha particle emitter is a sheet material, the sheet material being located proximate to a region of the integrated circuit die associated with the memory cells responsive to the integrated circuit die and the integrated circuit package being coupled to one another.

16. The device according to claim 15, wherein the sheet material includes thorium.

17. The device according to claim 16, wherein the integrated circuit package is a flip-chip fine-pitch ball grid array package.

* * * * *